(12) United States Patent
Yamazaki et al.

(10) Patent No.: US 9,117,621 B2
(45) Date of Patent: Aug. 25, 2015

(54) RADIATION GENERATING TUBE, RADIATION GENERATING UNIT, AND RADIATION IMAGE TAKING SYSTEM

(71) Applicant: CANON KABUSHIKI KAISHA, Tokyo (JP)

(72) Inventors: Koji Yamazaki, Ayase (JP); Yoshio Suzuki, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 170 days.

(21) Appl. No.: 13/971,020

(22) Filed: Aug. 20, 2013

(65) Prior Publication Data

US 2014/0056406 A1 Feb. 27, 2014

(30) Foreign Application Priority Data

Aug. 21, 2012 (JP) ................................. 2012-182295

(51) Int. Cl.
*H01J 35/04* (2006.01)
*H01J 37/09* (2006.01)
*H01J 35/16* (2006.01)
*H05G 1/06* (2006.01)

(52) U.S. Cl.
CPC ................. *H01J 35/04* (2013.01); *H01J 35/16* (2013.01); *H01J 37/09* (2013.01); *H01J 2235/087* (2013.01); *H01J 2237/0206* (2013.01); *H05G 1/06* (2013.01)

(58) Field of Classification Search
CPC ........... H01J 35/02; H01J 35/04; H01J 35/16; H01J 35/18; H01J 37/02; H01J 37/06; H01J 37/07; H01J 37/09; H01J 37/065; H01J 2237/0206
USPC .......................................................... 378/62
See application file for complete search history.

(56) References Cited

U.S. PATENT DOCUMENTS

| | | | | |
|---|---|---|---|---|
| 2,909,686 | A | * | 10/1959 | Zunick ......................... 378/140 |
| 6,330,304 | B1 | * | 12/2001 | Warburton .................... 378/131 |
| 7,010,093 | B2 | * | 3/2006 | Lenz et al. .................... 378/121 |
| 2007/0076849 | A1 | | 4/2007 | Bard et al. |

* cited by examiner

*Primary Examiner* — Thomas R Artman
*Assistant Examiner* — Madhu Gowda
(74) *Attorney, Agent, or Firm* — Canon USA Inc. IP Division

(57) ABSTRACT

A radiation generating tube includes a vacuum envelope formed by an insulating tube, a cathode and an anode. At least one of the cathode and the anode is bonded to the insulating tube via a conductive bonding material disposed between bonded surfaces facing each other. The conductive bonding material is partially protruding from between the bonded surfaces to an outer peripheral surface or an inner peripheral surface of the insulating tube. A concave portion is formed on the outer peripheral surface or the inner peripheral surface of the insulating tube adjacent to a bonded surface on an insulating tube side, and a distal end of a conductive bonding material protruding from between bonded surfaces is accommodated in the concave portion.

15 Claims, 6 Drawing Sheets

RADIATION GENERATING TUBE, RADIATION GENERATING UNIT, AND RADIATION IMAGE TAKING SYSTEM

BACKGROUND OF THE INVENTION

1. Field of the Invention

The present disclosure relates to a radiation generating tube, a radiation generating unit provided with the radiation generating tube as a radiation source, and a radiation image taking system using the radiation generating unit.

2. Description of the Related Art

In the related art, a vacuum envelope including an insulating tube and a conductive electrode is used as a radiation generating tube used as a radiation source of a radiation generating unit. US Patent Application Publication No. 2007/0076849 A1 (U.S. Pat. No. 7,382,862) discusses a brazing material that is used for joining an insulating tube and an electrode of a radiation generating unit.

The vacuum envelope of the radiation generating tube requires sealing properties which maintain an internal vacuum atmosphere. Therefore, joining between the insulating tube and the electrode may be performed using a sufficient required amount of a conductive bonding material such as brazing material in order to enhance reliability by achieving a stable sealed state.

However, when the sufficient required amount of the conductive bonding material is used to join the insulating tube and the electrode, the conductive bonding material is easily protruding from between a bonded surface of the insulating tube and a bonded surface of the electrode facing each other (hereinafter, referred to as "between bonded surfaces" in this specification). When the conductive bonding material is protruding from between the bonded surfaces, an electric field tends to concentrate on a distal end of the protruding conductive bonding material when the radiation generating tube is driven, and hence, depending on the shape of the protruding conductive bonding material, there is a risk of induction of abnormal emission in the radiation generating apparatus in which the radiation generating tube is used.

In the radiation generating unit and the radiation image taking system, improvement of a voltage withstand property of the radiation generating tube to be used is required for accommodating size reduction or power increase of radiation to be emitted. In addition, operation stability increases and high voltage application is enabled with the improvement of the voltage withstand property, whereby improvement of performance is expected. As regards the vacuum envelope of the radiation generating tube, reliability and performance of the radiation generating unit and the radiation image taking system using the same may be improved by the improvement of the voltage withstand property simultaneously with a stable sealing property.

SUMMARY OF THE INVENTION

The present disclosure discloses a technique to obtain a stable sealed state at joining between an electrode and an insulating tube which constitute a vacuum envelope of a radiation generating tube, and simultaneously suppress an electric field concentration caused by a conductive bonding material protruding from between the bonded surfaces. The present disclosure also provides improvement of reliability and performance of a radiation generating unit and a radiation image taking system.

A first aspect of the present disclosure is a radiation generating tube including: a vacuum envelope having an insulating tube, a cathode bonded to one of openings of the insulating tube, and an anode bonded to other one of the openings of the insulating tube;

an electron emission source connected to the cathode; and a target connected to the anode, at least one of the cathode and the anode, and the insulating tube respectively having bonded surfaces bonded via a conductive bonding material and facing each other, and the conductive bonding material partly protruding from between a bonded surface on the insulating tube side and a bonded surface on the electrode side to an outer peripheral surface or an inner peripheral surface of the insulating tube, wherein a concave portion is formed on the outer peripheral surface or the inner peripheral surface of the insulating tube adjacent to the bonded surface on the insulating tube side, and a distal end of the protruding conductive bonding material is accommodated in the interior of the concave portion.

A second aspect of the present disclosure is a radiation generating unit including: the radiation generating tube according to the first aspect, and a storage container in which the radiation generating tube is stored, wherein the storage container includes an emission window configured to allow a radiation generated from the radiation generating tube to be taken out, and an excessive space of the interior in which the radiation generating tube is stored is filled with insulating liquid.

A third aspect of the present disclosure is a radiation image taking system including: the radiation generating unit according to the second aspect, a radiation detecting apparatus configured to detect a radiation emitted from the radiation generating unit and passed through an object to be examined;

and a control apparatus configured to control the radiation generating apparatus and the radiation detecting apparatus in coordination with each other.

Further features of the present invention will become apparent from the following description of exemplary embodiments with reference to the attached drawings.

DESCRIPTION OF THE EMBODIMENTS

Figure 1:
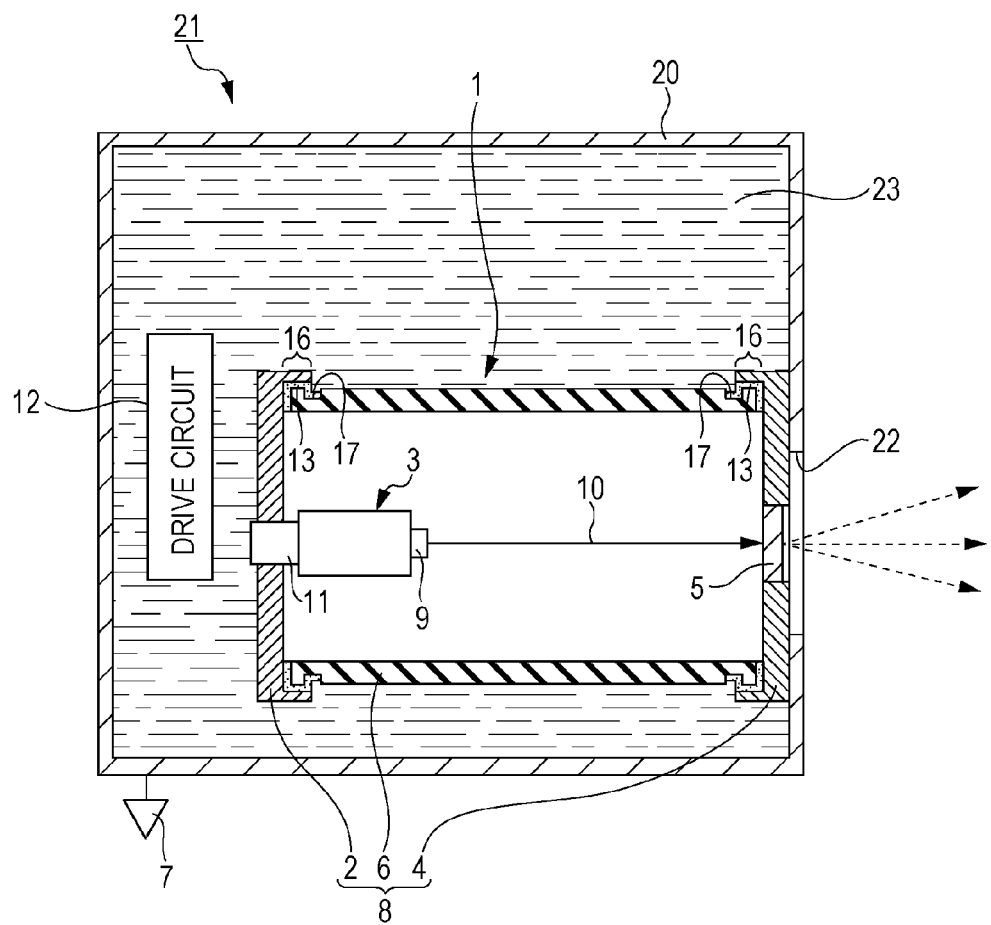
FIG. 1 is a cross-sectional view of a radiation generating unit of the present disclosure.

Referring now to the drawings, the present disclosure will be described further in detail. In the drawings that are referred to below, the same reference numerals indicate the same components.

Figure 2:
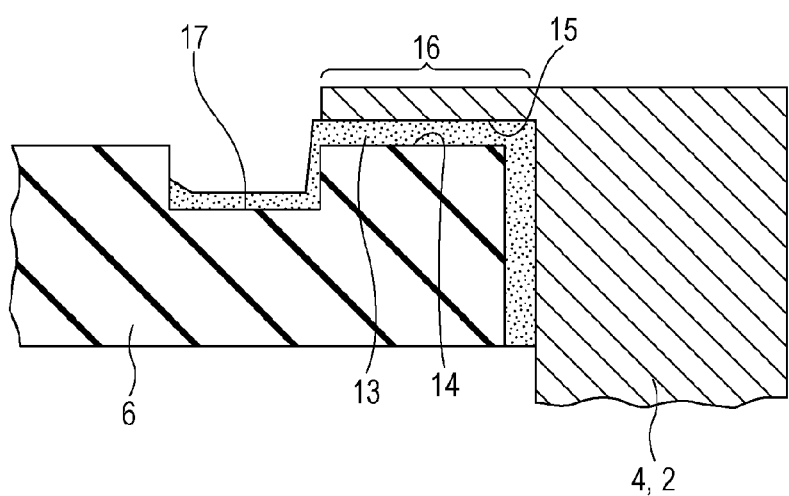
FIG. 2 is an enlarged cross-sectional view of a joint portion between an electrode and an insulating tube of a radiation generating tube of the present disclosure used in the radiation generating unit in FIG. 1.

Referring to FIG. 1 and FIG. 2, an example of configuration of a radiation generating tube and a radiation emitting apparatus of the present disclosure will be described.

A radiation generating tube 1 includes an electron emission source (electron gun) 3, a target 5, and a vacuum envelope 8. The vacuum envelope 8 includes an insulating tube 6 having opposite openings, a cathode 2 serves as first electrode bonded to one of openings of the insulating tube 6, and an anode 4 serves as a second electrode connected to the other opening of the tube 6.

The electron emission source 3 includes an electron emitting portion 9 configured to emit electrons and a current feed-through terminal 11 connected to the cathode 2. The electron emission source 3 is at least configured to have an electron emitting function which may control the amount of emission of electrons from the outside of the vacuum envelope 8, and a cold cathode-type electron emission source, a heat cathode-type electron emission source, or the like may be applied as needed. In view of a configuration in which a large-current electron ray 10 may be taken out stably, the heat cathode type electron emission source of an impregnation type cathode may be used suitably. The electron emission source 3 is electrically connected to a drive circuit 12 arranged outside of the vacuum envelope 8. The drive circuit 12 is configured to, among other things, control of the amount of electron emission and control ON-OFF timing of electron emission via the current feed-through terminal 11 provided at the cathode 2. In this embodiment, the drive circuit 12 is installed on the outside of the vacuum envelope 8, but it alternatively may be installed in the interior of the vacuum envelope 8.

The interior of the vacuum envelope 8 is decompressed (evacuated) to an extent which allows irradiation of the target 5 with electrons emitted from the electron emitting portion 9 provided on the electron emission source 3 as the electron ray 10. The degree of vacuum of an internal space of the vacuum envelope 8 may be selected as appropriate by considering the type of the electron emission source 3 to be used or driving conditions thereof. However, the degree of vacuum on the order of about $1 \times 10^{-8}$ to $1 \times 10^{-4}$ Pa is employed. When the cold cathode type electron emission source such as Spindt type or MIM is used as the electron emission source 3, the degree of vacuum not higher than $1 \times 10^{-6}$ Pa is preferable in terms of the stability of electron emitting characteristics. In order to maintain the degree of vacuum in the interior of the vacuum envelope 8, it is also possible to install a getter, not illustrated, in the internal space of the vacuum envelope 8 or in an auxiliary space, not illustrated, communicating with the internal space.

The cathode 2 defines a static electric field of a mounting portion of the electron emission source 3 with respect to the vacuum envelope 8 so as to alleviate spatial asymmetry of the static electric field in the periphery of the electron emission source 3 and not to generate a local electric field concentration. The electron emission source 3 includes the electron emitting portion 9; and the electron emitting portion 9 includes a bipolar electrode configured to supply emitted electronic current through a pair of emitter electrodes (not illustrated). When electro-optical functions such as focusing of the electron ray 10 and astigmatism correction are added, several auxiliary electrodes (not illustrated) may be additionally provided. An electrode group including the above-described pair of emitter electrodes and the auxiliary electrodes may be connected from the cathode 2 side via the drive circuit 12 and the current feed-through terminal 11 on the outside of the radiation generating tube 1. In view of alleviation of the asymmetry of the above-described static electric field, the cathode 2 may be defined at a low constant potential sufficiently lower than an electrode potential of the anode 4. It is also possible to define the potential of the cathode 2 to be the same as one of the pair of the emitter electrodes that supplies the potential of the electron emitting portion 9, or to be the same as an intermediate potential between the respective potentials of the pair of the emitter electrodes. Also, the auxiliary electrodes may be connected to a correction circuit, not illustrated, arranged on the outside of the radiation generating tube 1. A configuration in which both of the correction circuit and a voltage source are provided in the drive circuit 12 is also applicable.

The anode 4 defines the potential of the target 5 by the voltage source, not illustrated, and has a function to allow an anode current flowing through the target 5, described later, to be applied to a grounding terminal 7 via the voltage source. In addition, the anode 4 defines a static electric field in the periphery of the target 5 of the radiation generating tube 1 in the same manner as the cathode 2. The anode 4 may be provided with a shield, not illustrated, which may configured to define a range of radiation intensities, and the anode 4 and the target 5 may be connected via the shield.

The materials of the cathode 2 and the anode 4 may be determined in consideration of conductivity, sealing properties, strength, and matching of coefficients of linear thermal expansion with respect to that of the insulating tube 6. Examples of such materials include Kovar, tungsten, or the like.

The target 5 is provided with a target layer facing the electron emitting portion 9 and a supporting substrate supporting the target layer. The target layer (not shown in FIG. 1) is a member which generates radiation in response to being irradiated with electrons emitted from the electron emitting portion 9. Therefore, the target layer generally formed of a heavy metal material having an atomic number not smaller than 26. Specifically, metallic materials such as tungsten, molybdenum, chrome, copper, cobalt, iron, rhodium, and rhenium, or a film of an alloy material thereof, may be used. The target 5 is arranged with the target layer thereof oriented toward the electron emitting portion 9 so that irradiation of electrons emitted from the electron emitting portion 9 is received by the target layer.

A positive potential in the range of 10 kV to 200 kV with respect to the electron emitting portion 9 is applied to the target 5, and electrons emitted from the electron emitting portion 9 enter the target 5 as the electron ray 10 by an incident energy of 10 keV to 200 keV to generate radiations. Therefore, in view of suppression of the asymmetry of an electron distribution between the cathode 2 and the anode 4, a positive potential on the order of substantially the same degree as the potential of the target layer with respect to the electron emitting portion 9 may be applied to the anode 4 with respect to the cathode 2.

The target 5 is provided with a target material including a heavy element generating radiations by collision of electrons. The target 5 may be formed into a self-standing type, which is composed only of the target material, and as a form of the self-standing type, a form in which a diaphragm type metallic thin film is connected to the anode 4 is included. The target 5 may also be formed into a dispersion type containing the target material in the material which allows the radiations to pass therethrough in a dispersed state, or may be formed into a laminated form having a metallic thin film containing a target material laminated on a supporting substrate formed of a material which allows the radiations to pass therethrough. As a supporting substrate which allows the radiations to pass therethrough, a substrate formed of materials having low atomic numbers such as beryllium or diamond is suitable. The metallic thin film may be formed on the supporting substrate at a thickness of several μm in terms of suppression of attenuation of the radiations and in terms of suppressing defocusing due to the thermal deformation of the target 5. The metallic thin film used here may be a heavy metal material having atomic numbers not smaller than 26 in terms of conversion efficiency between the amount of radioactive amount and the amount of incoming electrons. Specifically, tungsten, molybdenum, chrome, copper, cobalt, iron, rhodium, or rhenium, or an alloy material thereof may be used. A method of forming the metallic thin film on the supporting substrate is not specifically limited as long as a sealing property with respect to the supporting substrate is secured. Examples of the method of forming the metallic thin film which may be used include various film-forming methods such as sputtering, chemical vapor-deposition (CVD), electroplating, or the like.

The insulating tube 6 has an electrical insulating property. The illustrated insulating tube 6 includes the openings at both ends thereof to which the cathode 2 and the anode 4 are bonded respectively. The vacuum envelope 8 composed of the insulating tube 6, the cathode 2, and the anode 4 may be of any type as long as an internal space, which allows irradiation of the target 5 with electrons emitted from the electron emitting portion 9, is formed therein. In other words, the vacuum envelope 8 may include not only a form in which the cathode 2 and the anode 4 are exposed and face each other as illustrated in FIG. 1, but also a form in which the internal space of the insulating tube 6 is partitioned by a partitioning wall, not illustrated, and the electron emission source 3 is installed through a partitioning wall. A form in which the anode 4 or the cathode 2 is connected to a side surface of the insulating tube 6 is also applicable. In addition, a form in which the cathode 2 and the anode 4 do not face each other and are bonded at a positional relationship not in parallel is also applicable. The outer peripheral shape and the inner peripheral shape of the cross section of the insulating tube 6 are not limited to a circular shape, and may be a polygonal shape. The material of the insulating tube 6 is selected in terms of the electric insulating property, air-tightness, the low gas emission property, heat resistance, and matching of the coefficient of linear thermal expansion with respect to the cathode 2 or the anode 4. Examples of suitable materials for the insulating tube 6 included insulative ceramic such as boron nitride and alumina, and insulative inorganic glass such as borosilicic acid glass and other like materials.

In this embodiment, both of the cathode 2 and the anode 4 are bonded to the insulating tube 6 so as to interpose a conductive bonding material 13 between a bonded surface 14 on the insulating tube side and a bonded surface 15 on the electrode side opposing each other. However, joining by the insulating tube 6 and the conductive bonding material 13 may be applied only to one of the cathode 2 and the anode 4. The conductive bonding material 13 may be hard solder such as silver solder or copper solder (brazing alloy). Advantageously, these materials have a conductive property and a heat resistant property and, in addition, have a good joining property between the electrode material and the insulating material, that is, between different types of material.

The conductive bonding material 13 desirably has a fusing point lower than both of the insulating tube 6 and at least one of the electrodes to be bonded in order to prevent deformation thereof in the joining process. The conductive bonding material 13 also has a malleability property which allows the material to be subjected to softening and deformation in comparison with the insulating tube 6 and at least one of the electrodes to be bonded. In association, the conductive bonding material 13 may have a good wettability with respect to the insulating tube 6 and the at least one of the electrodes to be bonded, and has a property of coming easily into close contact.

In this embodiment, as illustrated in FIG. 2, a extending portion 16 extends from the peripheral edge of each of the cathode 2 and the anode 4 and an end portion of the insulating tube 6 is inserted into the inside of the extending portion 16. An outer peripheral surface of the end portion of the insulating tube 6 inserted into the inside of the extending portion 16 and an inner peripheral surface of the extending portion 16 face each other, and constitute the bonded surface 14 on the insulating tube side and the bonded surface 15 on the electrode side. In addition, the conductive bonding material 13 is interposed between the bonded surface 14 on the insulating tube side and the bonded surface 15 on the electrode side.

In order to achieve a good vacuum air-tightness of the vacuum envelope 8, a sufficient required amount of the conductive bonding material 13 is needed, and as a result, the conductive bonding material 13 is extruded and protruding from between the both bonded surfaces 14 and 15. The conductive bonding material 13 protruding to the outer peripheral surface of the insulating tube 6 is defined to have substantially the same potential as the cathode 2 and the anode 4. The electric field concentration may occur depending on the state of the protruding conductive bonding material 13. A local projecting deformation or shape distribution occurs is observed on the protruding conductive bonding material 13. Such a shape distribution of the conductive bonding material 13 further accelerates the electric field concentration. When the electric field concentration point as described above is exposed to the other electrode, the voltage withstand property is further restricted.

In this embodiment, in order to prevent deterioration of voltage withstand property due to the squeezing out of the conductive bonding material 13, a concave portion 17 is formed on the outer peripheral surface of the insulating tube 6 adjacent to the bonded surface 14 on the insulating tube side, and a distal end of the protruding conductive bonding material 13 is accommodated in the concave portion 17. By accommodating the distal end of the conductive bonding material 13 in the inside of the concave portion 17, the distal end of the conductive bonding material 13 protruding at the joint portion of the anode 4, for example, may be prevented from facing the cathode 2 in an exposed state, so that the electric field concentration may be suppressed. In addition, by forming the concave portion 17 adjacent to the bonded surface 14 on the insulating tube side, the distal end of the protruding conductive bonding material 13 may be accommodated therein reliably. The concave portion 17 may be formed in parallel to an end edge of the insulating tube 6 so as not to disturb the electric field.

Figure 3A:
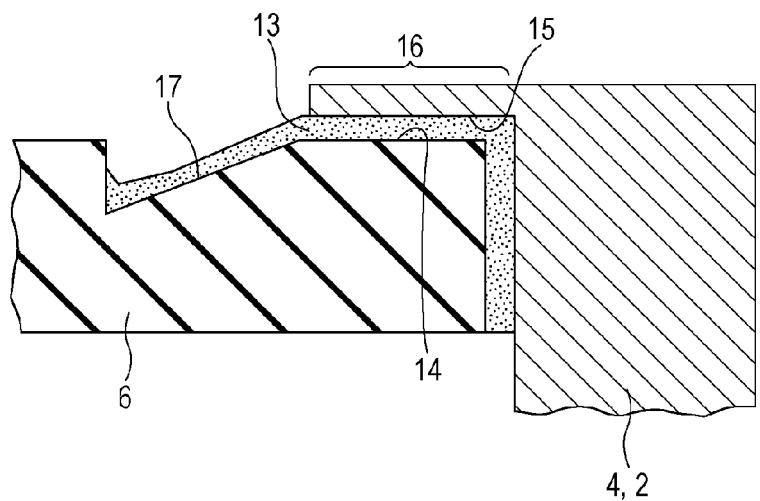
FIG. 3A is an enlarged cross-sectional view of the joint portion between the electrode and the insulating tube of the radiation generating tube of the present disclosure illustrating an example of a concave portion.
Figure 3B:
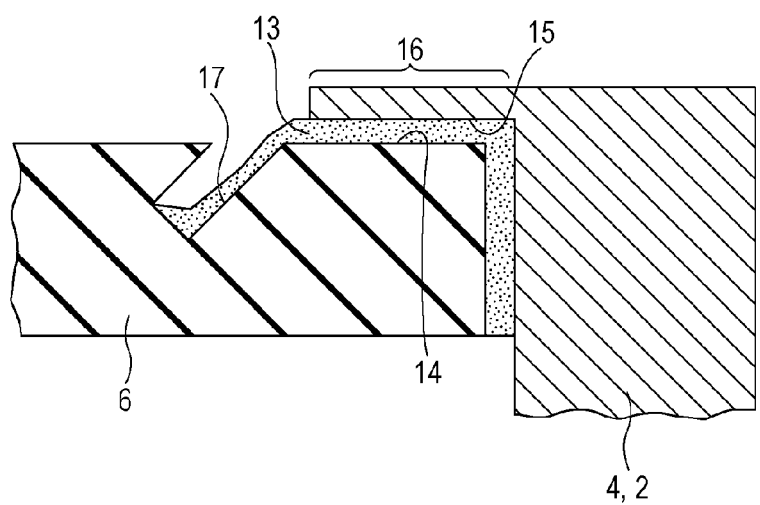
FIG. 3B is an enlarged cross-sectional view of the joint portion between the electrode and the insulating tube of the radiation generating tube of the present disclosure illustrating an example of another concave portion.

The cross-sectional shape of the concave portion 17 in the transverse direction as illustrated in FIG. 2 has a rectangular shape having a side surface at a right angle with respect to a bottom surface. However, the cross-sectional shapes as illustrated in FIGS. 3A and 3B are also applicable. The concave portion 17 as illustrated in FIG. 3A has a cross-sectional shape in the transverse direction gradually increasing in depth as the distance from one of the electrodes to be bonded (the anode 4 or the cathode 2) increases. In this shape, occurrence of the electric field concentration generated at a deformed point of the conductive bonding material 13 caused by the protruding conductive bonding material 13 falling abruptly down into the concave portion 17 is suppressed easily. The concave portion 17 as illustrated in FIG. 3B is the same as the concave portion 17 in FIG. 2 in that the side surface has a rectangular shape and extends at a right angle with respect to the bottom surface, but has a shape inclined toward one of the electrodes to be bonded (the anode 4 or the cathode 2). In this configuration, the conductive bonding material 13 may be retained reliably in the concave portion 17.

In this manner, by preventing the distal end of the conductive bonding material 13 from becoming pointed and being exposed to the other electrode, the voltage withstand property characteristic is improved.

Figure 4:
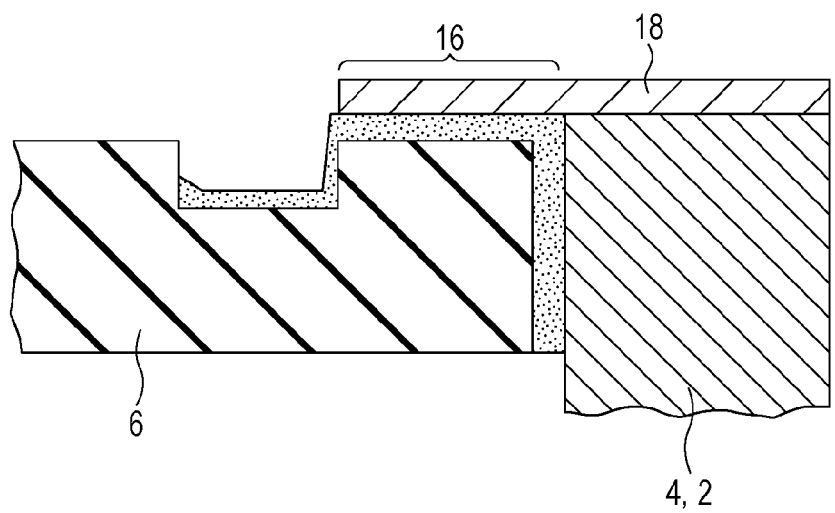
FIG. 4 is an enlarged cross-sectional view of the joint portion between the electrode and the insulating tube of the radiation generating tube of the present disclosure illustrating an example of joining therebetween via a sleeve.

The extending portion 16 formed at the peripheral edge of the electrode to be bonded may be formed continuously and integrally with the anode 4 or the cathode 2 as illustrated in FIG. 2, FIGS. 3A and 3B, and may be formed by a sleeve 18 bonded to the anode 4 or the cathode 2 as illustrated in FIG. 4. In other words, the sleeve 18 may be mounted on an outer periphery of the anode 4 or the cathode 2 so as to project at one end thereof toward the insulating tube 6 to form the extending portion 16 by a portion projected toward the insulating tube 6. Mounting of the sleeve 18 on the anode 4 or the cathode 2 may be performed by using the conductive bonding material 13.

Figure 5:
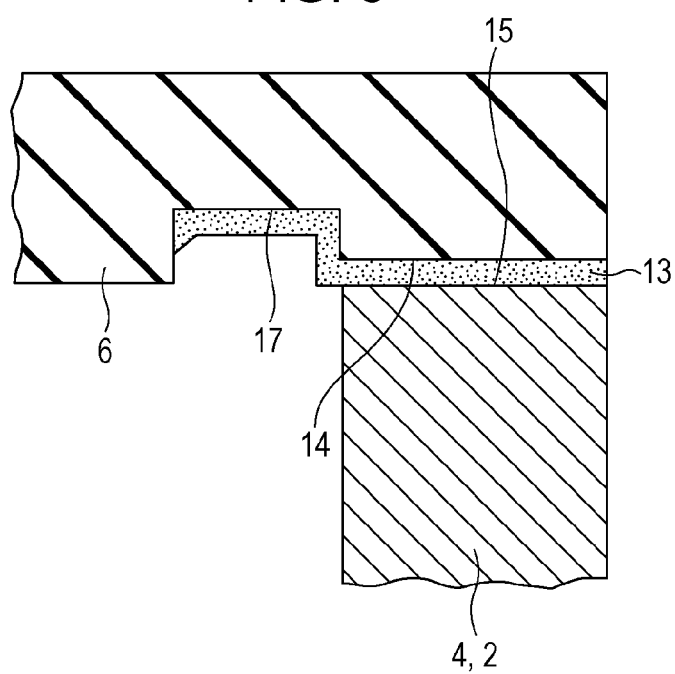
FIG. 5 is an enlarged cross-sectional view of the joint portion between the electrode and the insulating tube of the radiation generating tube of the present disclosure illustrating an example in which the concave portion is provided on an inner peripheral surface of the insulating tube.

Joining of the insulating tube 6 with the anode 4 or the cathode 2 is achieved by fitting the anode 4 or the cathode 2 in the insulating tube 6 as illustrated in FIG. 5. In FIG. 5, an outer peripheral surface of the anode 4 or the cathode 2 fitted into the insulating tube 6 constitutes the bonded surface 15 on the electrode side, and an inner peripheral surface of the insulating tube 6 facing the bonded surface 15 on the electrode side constitutes the bonded surface 14 on the insulating tube side. A concave portion having a rectangular cross-sectional shape in the transverse direction is formed on the inner peripheral surface of the insulating tube 6 adjacently to the bonded surface 14 on the insulating tube side. The conductive bonding material 13 is interposed between the bonded surface 14 on the insulating tube side and the bonded surface 15 on the electrode side, and the distal end of the conductive bonding material 13 protruding from between the bonded surface 14 on the insulating tube side and the bonded surface 15 on the electrode side is accommodated in the concave portion 17. In this configuration, occurrence of electric discharge on the inner surface side of the insulating tube 6 by the field concentration at a distal end portion of the protruding conductive bonding material 13 may be prevented.

Figure 6A:
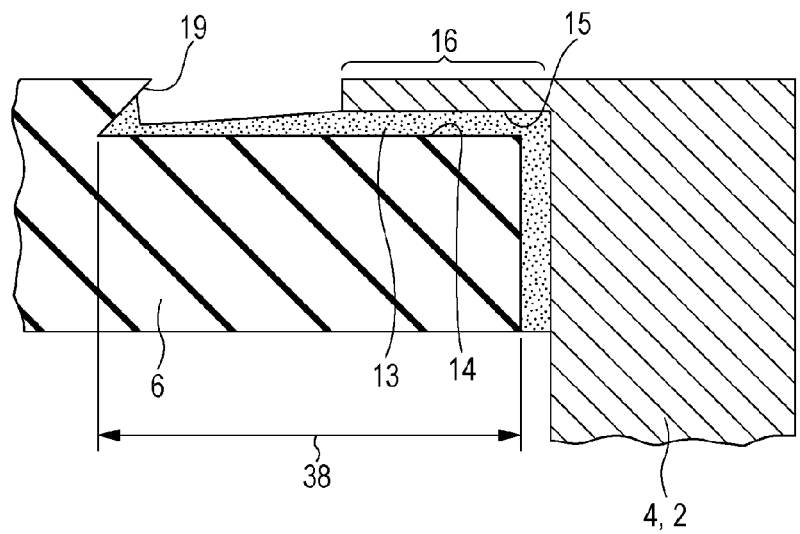
FIG. 6A is an enlarged cross-sectional view illustrating another example of the joint portion between the electrode and the insulating tube of the radiation generating tube of the present disclosure in which a shoulder portion is formed on an outer peripheral surface side of the insulating tube.
Figure 6B:
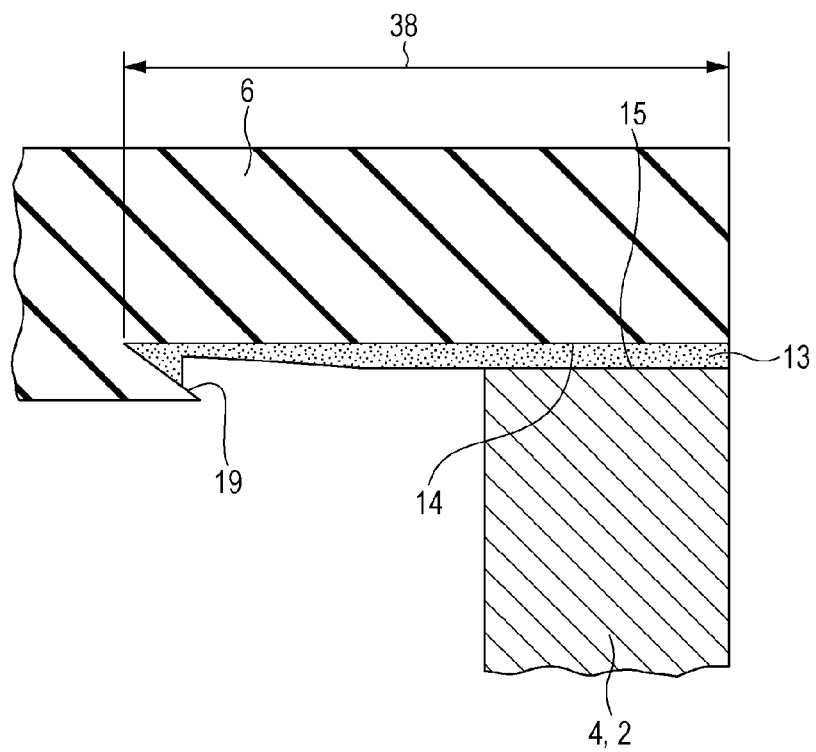
FIG. 6B is an enlarged cross-sectional view illustrating another example of the joint portion between the electrode and the insulating tube of the radiation generating tube in which the shoulder portion is formed on the inner peripheral surface side of the insulating tube.

FIGS. 6A and 6B illustrate an example in which a thinned portion 38 is formed instead of the concave portion 17. The bonded surface 14 on the insulating tube side in FIG. 6A corresponds to the outer peripheral surface of the insulating tube 6 facing the inner peripheral surface of the extending portion 16 of the anode 4 or the cathode 2. An end portion of the insulating tube 6 on the anode 4 or cathode 2 side to be bonded corresponds to the thinned portion 38 that is thinned via a shoulder portion 19 formed on an outer peripheral surface continuing to the bonded surface 14 on the insulating tube side between the end portion and the intermediate portion of the insulating tube 6. The shoulder portion 19 is formed so as to be inclined toward the anode 4 or the cathode 2 to be bonded. The bonded surface 14 on the insulating tube side in FIG. 6B corresponds to the inner peripheral surface of the insulating tube 6 facing the outer peripheral surface of the anode 4 or the cathode 2 fitted into the opening of the insulating tube 6. The end portion of the insulating tube 6 on the anode 4 or cathode 2 side to be bonded corresponds to the thinned portion 38 that is thinned via the shoulder portion 19 formed on the inner peripheral surface continuing to the bonded surface 14 on the insulating tube side between the end portion and the intermediate portion of the insulating tube 6. The shoulder portion 19 is formed so as to be inclined toward the anode 4 or the cathode 2 side to be bonded. In any of the examples in FIGS. 6A and 6B, the conductive bonding material 13 protruding from between the both bonded surfaces 14 and 15 is accommodated in the thinned portion 38. The same effect as the effect brought about by the concave portion 17 may be obtained also by forming the thinned portion 38 with the shoulder portion 19 as described above and accommodating the protruding conductive bonding material 13 therein.

As illustrated in FIG. 1, the radiation generating tube 1 may be stored in a storage container 20 to obtain a radiation generating unit 21. The storage container 20 is provided with an emission window 22 for the radiations so that the position of the emission window 22 is aligned with an outgoing direction of the radiations from the radiation generating tube 1. An excessive space in the storage container 20 accommodating the radiation generating tube 1 is filled with insulative fluid (insulating liquid 23) in terms of the voltage withstand property and stabilization of an operation property when the radiating generating unit 21 is driven. By introducing the insulating liquid 23, improvement of a heat-radiating property at the time of operation of the radiation generating tube 1 is enabled while securing an insulating property between the cathode 2 and the anode 4 of the radiation generating tube 1. The insulating liquid 23 may have a high electric insulation performance and a high cooling performance, and be less transformable by heat and, for example, insulating oil such as silicone oil, transformer oil, fluorine-containing oil, or fluorine-containing insulative liquid such as hydrofluoroether, or the like may be used.

The drive circuit 12 for driving the radiation generating tube 1 may be arranged in either the outside or the inside of the storage container 20.

The storage container 20 may be defined to a predetermined potential in terms of operation stability and safety of the radiation generating unit 21. A suitable predefined potential is a ground potential defined via the grounding terminal 7. As the material of the storage container 20, various materials may be selected, and metals such as iron, stainless steel, lead, brass, and copper may be used in terms of a radiation sealing property, strength, and surface potential defining performance.

The radiation generating tube of the present disclosure is not limited to the radiation generating tube provided with a transmission type target, and may be suitably applied to a radiation generating tube provided with a reflection type target.

Subsequently, an embodiment of a radiation image taking system according to the present disclosure will be described with reference to FIG. 7.

Figure 7:
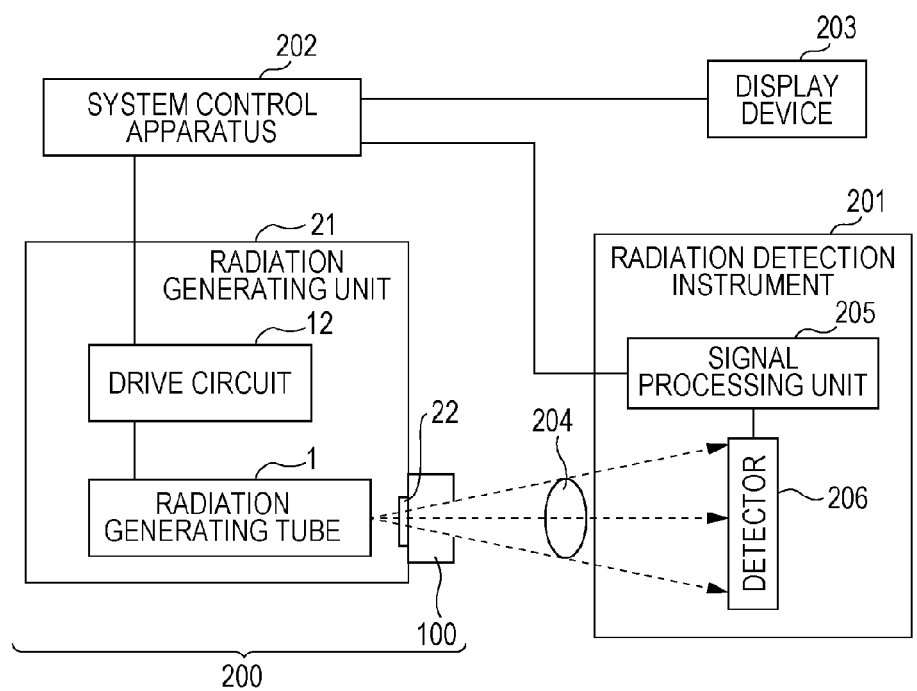
FIG. 7 is an explanatory diagram illustrating an example of a radiation image taking system of the present disclosure.

As illustrated in FIG. 7, the radiation generating unit 21 described above constitutes a radiation generating apparatus 200 together with a movable aperture unit 100 provided at a portion of the emission window 22 thereof. The movable aperture unit 100 has a function of adjusting the range of the irradiation field of the radiations radiated from the radiation generating unit 21. Also, the movable aperture unit 100 added with a function of displaying the irradiation field of the radiations by visible light in a simulated manner may be used.

A system control apparatus 202 controls the radiation generating apparatus 200 and a radiation detecting apparatus 201 in coordination with each other. The drive circuit 12 outputs various control signals to the radiation generating tube 1 under the control of the system control apparatus 202. With this control signal, a state of emission of the radiations emitted from the radiation generating apparatus 200 is controlled. A radiation emitted from the radiation generating apparatus 200 passes through an object to be examined 204, and is detected by a detector 206. The detector 206 converts the detected radiation to an image signal and outputs the signal to a signal processing unit 205. The signal processing unit 205 performs predetermined signal processing on the image signal under the control of the system control apparatus 202 and outputs the processed image signal to the system control apparatus 202. The system control apparatus 202 outputs, to a display device 203, a display signal for displaying an image on the display device 203 on the basis of the processed image signal. The display device 203 displays an image based on the display signal on a screen as a taken image of the object to be examined 204. A typical example of the radiation is an X-ray, and the radiation generating unit and the radiation image taking system of the present disclosure may be used as an X-ray generating unit and an X-ray image taking system. The X-ray image taking system may be used for a non-destructive test for industrial products and pathology diagnosis of human bodies or animals.

EXAMPLES

Example 1

The radiation generating tube 1 of this example was manufactured as follows.

First, a high-pressure synthesized diamond manufactured by Sumitomo Electric Industries, Ltd. was prepared as a supporting substrate for manufacturing the target 5. The supporting substrate had a disk (cylindrical) shape having a diameter of 5 mm and a thickness of 1 mm. Organic substance existing on the surface of the supporting substrate was removed from the prepared supporting substrate by UV-ozone ashing.

An adhesion layer of 10 nm in thickness is formed of titanium by sputtering on one of two circular surfaces of the supporting substrate having a diameter of 1 mm with Ar as carrier gas. The supporting substrate at the time of forming a titanium film was heated by stage heating so as to be 260° C. Subsequently, a target layer was formed continuously on the adhesion film layer by forming a film of tungsten by spattering with Ar as carrier gas without venting the atmosphere of a film forming apparatus. At this time, the target layer was formed to have a thickness of 7 μm. The supporting substrate formed of diamond was heated by stage heating at the time of forming the film of tungsten so as to be 260° C. in the same manner as the case of formation of the tungsten film.

The thicknesses of the adhesion layer formed of titanium and the target layer formed of tungsten were each adjusted so as to become a specified film thickness based on film formation time by acquiring calibration curve data on the film thickness as a single film and the time required for forming the film in advance before being laminated. The measurement of the film thickness for acquiring the calibration curve data was performed by using a spectroscopic ellipsometer "UVISEL ER" manufactured by HORIBA Ltd. In this manner, the target 5 formed by laminating the supporting substrate formed of diamond, the adhesion layer formed of titanium, and the target layer formed of tungsten in this order was obtained.

Subsequently, a disk-shaped metallic plate formed of Kovar having a diameter of 60 mmφ and a thickness of 3 mm was processed to form a column-shaped opening having a diameter of 1.1 mmφ at the center thereof so that the anode 4 was obtained. Furthermore, the sleeve 18 having an inner periphery of 60 mm, an outer periphery of 61 mm, and an amount of protruding from the anode 4 of 5 mm was provided on the outer peripheral portion of the anode 4. Organic solvent washing, rinsing, and UV-ozone ashing were performed on the anode 4, so that organic substance existing on the surface of the anode 4 was removed.

Subsequently, silver solder was applied as a joint member between the opening of the anode 4 and an outer peripheral portion of the disk-shaped target 5 for brazing, whereby the anode 4 having the target 5 connected thereto was obtained.

Subsequently, a disk-shaped metallic plate formed of Kovar having a diameter of 60 mmφ and a thickness of 3 mm was provided with the feed-through 11 at the center thereof in advance so that the cathode 2 was obtained. The cathode 2 is also provided with the sleeve 18 in the same manner as the anode 4. Washing, which was the same procedure as that performed on the anode 4, was performed on the cathode 2, and organic solvent washing, rinsing, and UV-ozone ashing were performed on the cathode 2, so that organic substance existing on the surface of the cathode 2 was removed.

Subsequently, the feed-through 11 and an impregnated electronic gun were connected electrically and mechanically, so that the cathode 2 connected to the electron emission source 3 was obtained.

Subsequently, the insulating tube 6 of a cylindrical tube shape having a length of 70 mm, an outer diameter of 60 mm, and an inner diameter of 50 mm and formed of alumina was prepared. The insulating tube 6 is formed with the concave portion 17 in an annular shape as illustrated in FIG. 2 in an enlarged scale. A portion from a position at 5 mm to a position at 8 mm from two openings of the insulating tube 6 was dented by 1 mm to form the concave portion 17. The same washing as performed on the cathode 2 and the anode 4 was performed also on the insulating tube 6, and organic substance on the surface was removed.

Subsequently, silver solder of Japan Industrial Standards BAg-8 (Ag72-CU28, fusing point: 780° C.) formed into an annular shape was inserted between a surface, provided with the electron emission source 3, of the cathode 2 connected to the electron emission source 3 and one of opening ends of the insulating tube 6, and brazing was performed at a temperature of 820° C. With this brazing, the joint portion provided with the conductive bonding material 13 which is hermetically bonded in an annular shape was formed. In this case, the silver solder is leaked out also into a space between an inner periphery of the sleeve 18 of the cathode 2 and the insulating tube 6, so that further reliable hermetic joint was achieved.

Subsequently, the other opening end of the insulating tube 6 and the surface of the anode 4 on the side where the tungsten of the target 5 is exposed were brazed in the same manner as the joint on the cathode 2 side, and a joint portion provided with the conductive bonding material 13 hermetically bonded in an annular shape was formed. In this case, the silver solder is leaked out also into a space between the inner periphery of the sleeve 18 of the anode 4 and the insulating tube 6, so that further reliable hermetic joint was achieved.

With the procedure described above, the vacuum envelope 8 connecting the cathode 2 and the anode 4 to the insulating tube 6 at the respective two opening ends of the insulating tube 6 by hermetic joint was formed.

Subsequently, the interior of the vacuum envelope 8 was evacuated to achieve a degree of vacuum of $1\times10^{-5}$ Pa by an exhaust pipe and an exhaust apparatus, not illustrated, then the radiation generating tube 1 was manufactured by sealing the exhaust tube.

In the method as described above, five radiation generating tubes 1 were manufactured and the portions in the peripheries of the concave portions 17 were observed. As a consequence, the fact was confirmed that the silver solder leaked out from between the bonded surfaces was accommodated in the concave portion 17 and was not leaked out to the opposite side of the joint portion with the concave portion 17 therebetween. Furthermore, a high-voltage application was tried in the insulating liquid 23 used when configuring the radiation generating unit 21. The cathode 2 was grounded, the anode 4 was connected to a high-voltage power source, and the anode voltage was increased gradually to 140 kV. Application of a voltage to 140 kV was allowed stably for all of the five radiation generating tubes 1.

When the manufactured radiation generating tubes 1 described above were each used for configuring the radiation generating unit 21 and driven, emission of an X-ray, which was a radiation, was stably observed.

Comparative Example 1

Five radiation generating tubes of comparative examples were manufactured by the same manufacturing process as that Example 1 without providing the concave portion on the insulating tube 6 for the radiation generating tubes 1 manufactured in Example 1.

When the silver solder leaked out from the joint portions of the manufactured radiation generating tubes was observed, the distal end portions have a wavy form. In addition, the high-voltage application in the same manner as Example 1 was tried. All of the five radiation generating tubes continuously discharged at voltages not higher than 140 kV, and hence the voltage of 140 kV could not be stably applied. When the points where discharge occurred were observed, a signature of spread of the silver solder was confirmed.

Example 2

The shoulder portion 19 illustrated in FIG. 6A was provided on the radiation generating tube 1 manufactured in Example 1 without providing the concave portion on the insulating tube 6. In this case, the insulating tube 6 was formed to have an outer diameter of 58 mm from the two openings along the outer peripheral surface thereof to positions of 8 mm in the direction of a center axis respectively, and this area was formed to be the thinned portion 38. The outer diameter after having climbed over the shoulder portions 19 (the outer diameter of the intermediate portion) along the outer peripheral surface was 60 mm, which was the same as in Example 1. Also, each of the shoulder portions 19 had an inclination of 60° to the opening end sides respectively, and forms an inclined surface overlapping with an area having an outer diameter of 58 mm.

Five radiation generating tubes as described above were manufactured by the same manufacturing process as in Example 1.

When the silver solder leaked out from the joint portion of the radiation generating tube 1 manufactured in this example was observed, the fact was confirmed that the silver solder stayed on the thinned portion 38 side within the shoulder portion 19, and did not spread over the shoulder portion 19. In addition, the high-voltage application in the same manner as in Example 1 was tried. Application of a voltage to 140 kV was allowed finally for all of the five radiation generating tubes 1.

When the manufactured radiation generating tubes 1 described above were each used for configuring the radiation generating unit 21 and driven, emission of an X-ray, which was a radiation, was stably conformed.

Advantages of the Invention

According to a radiation generating tube of the present disclosure, a conductive bonding material protruding from between bonded surfaces is accommodated in a concave portion. Therefore, a distal end of the conductive bonding material protruding from the bonded surfaces between one of the electrodes and an insulating tube does not directly face the other electrode, so that an electric field concentration in a state of being driven may be prevented. Therefore, according to the present disclosure, the radiation generating tube having a good voltage withstand property is achieved.

Also, according to the radiation generating unit using the radiation generating tube of the present disclosure, a stable sealing property and a high voltage withstand property may be maintained for a long time. Therefore, performances such as reliability and radiation output stability of the radiation generating unit and a radiation image taking system may be enhanced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-182295, filed Aug. 21, 2012 which is hereby incorporated by reference herein in its entirety.

What is claimed is:

1. A radiation generating tube comprising:
a vacuum envelope having an insulating tube, a cathode bonded to one of openings of the insulating tube, and an anode bonded to other one of the openings of the insulating tube;
an electron emission source connected to the cathode; and
a target connected to the anode,
wherein at least one of the cathode and the anode, and the insulating tube have a pair of bonded surfaces bonded via a conductive bonding material disposed between the pair of bonded surfaces facing each other,
wherein the conductive bonding material is partly protruding from between the pair of bonded surfaces on the insulating tube side and the pair of bonded surfaces on the electrode side to an outer peripheral surface or an inner peripheral surface of the insulating tube, and
wherein a concave portion is formed on the outer peripheral surface or on the inner peripheral surface of the insulating tube adjacent to one of the pair of bonded surfaces on the insulating tube side, and a distal end of the protruding conductive bonding material is accommodated in the interior of the concave portion.

2. The radiation generating tube according to claim 1, wherein the at least one of the electrodes includes an extending portion extending from a peripheral edge of the electrode to the insulating tube side, and one of end portions of the insulating tube is inserted into the inside of the extending portion, the inner peripheral surface of the extending portion and the outer peripheral surface of the one of the end portions of the insulating tube inserted into the inside of the extending portion constitute the both bonded surfaces, and the concave portion is formed on the outer peripheral surface of the insulating tube.

3. The radiation generating tube according to claim 2, wherein the extending portion is formed of a sleeve mounted on an outer periphery of the at least one of the electrodes.

4. The radiation generating tube according to claim 1, wherein the at least one of the electrodes is fitted in the inner side of the opening of the insulating tube, the outer peripheral surface of the at least one of the electrodes fitted in the inner side of the opening of the insulating tube and the inner peripheral surface of the insulating tube facing the outer peripheral surface of the one of the electrodes constitute the both bonded surfaces, and the concave portion is formed on the inner peripheral surface of the insulating tube.

5. The radiation generating tube according to claim 1, wherein the cross-sectional shape of the concave portion in the transverse direction is a rectangular shape having a side surface at a right angle with respect to a bottom surface.

6. The radiation generating tube according to claim 1, wherein the cross-sectional shape of the concave portion in the transverse direction is a shape increasing in depth as the distance from the at least one of the electrodes increases.

7. The radiation generating tube according to claim 5, wherein the cross-sectional shape of the concave portion in the transverse direction is a shape inclining toward the at least one of the electrodes.

8. The radiation generating tube according to claim 1, wherein the concave portion is formed in parallel to an end edge of the insulating tube on the side where the at least one of the electrodes is bonded.

9. The radiation generating tube according to claim 1, wherein a thinned portion is formed instead of the concave portion by reducing the thickness of an end portion of the insulating tube on the side of the at least one of the electrodes as compared to a thickness of an intermediate portion of the insulating tube via a shoulder portion formed on the outer peripheral surface or the inner peripheral surface of the insulating tube so as to incline toward the at least one of the electrodes, and the distal end of the conductive bonding material protruding from between the both bonded surfaces is accommodated on the side of the at least one of the electrodes within the shouldered portion.

10. The radiation generating tube according to claim 1, wherein a fusing point of the conductive bonding material is lower than fusing points of the at least one of the electrodes and the insulating tube.

11. The radiation generating tube according to claim 10, wherein the conductive bonding material is hard solder.

12. A radiation generating unit comprising:
a radiation generating tube comprising:
a vacuum envelope having an insulating tube, a cathode bonded to one of openings of the insulating tube, and an anode bonded to other one of the openings of the insulating tube;
an electron emission source connected to the cathode; and
a target connected to the anode,
wherein at least one of the cathode and the anode, and the insulating tube have a pair of bonded surfaces bonded via a conductive bonding material disposed between the pair of bonded surfaces facing each other,
wherein the conductive bonding material is partly protruding from between the pair of bonded surfaces on the insulating tube side and the pair of bonded surfaces on the electrode side to an outer peripheral surface or an inner peripheral surface of the insulating tube, and
wherein a concave portion is formed on the outer peripheral surface or the inner peripheral surface of the insulating tube adjacent to one of the pair of bonded surfaces on the insulating tube side, and a distal end of the protruding conductive bonding material is accommodated in the interior of the concave portion;
and a storage container in which the radiation generating tube is stored, wherein the storage container includes an emission window configured to allow radiation generated from the radiation generating tube to pass therethrough, and an excessive space of the storage container in which the radiation generating tube is stored is filled with insulating liquid.

13. The radiation generating unit according to claim 12, wherein the insulating liquid is silicone oil, transformer oil, or fluorine-containing oil.

14. A radiography system comprising:
a radiation generating unit comprising:
a radiation generating tube comprising:
a vacuum envelope having an insulating tube, a cathode bonded to one of openings of the insulating tube, and an anode bonded to other one of the openings of the insulating tube;
an electron emission source connected to the cathode; and
a target connected to the anode,
wherein at least one of the cathode and the anode, and the insulating tube have a pair of bonded surfaces bonded via a conductive bonding material disposed between the pair of bonded surfaces facing each other,
wherein the conductive bonding material is partly protruding from between the pair of bonded surfaces on the insulating tube side and the pair of bonded surfaces on the electrode side to an outer peripheral surface or an inner peripheral surface of the insulating tube, and
wherein a concave portion is formed on the outer peripheral surface or the inner peripheral surface of the insulating tube adjacent to one of the pair of bonded surfaces on the insulating tube side, and a distal end of the protruding conductive bonding material is accommodated in the interior of the concave portion, and
a storage container in which the radiation generating tube is stored, wherein the storage container includes an emission window configured to allow radiation generated from the radiation generating tube to pass therethrough, and an excess space of the storage container in which the radiation generating tube is stored is filled with insulating liquid;
a radiation detecting apparatus configured to detect a radiation emitted from the radiation generating unit and passed through an object to be examined; and
a control apparatus configured to control the radiation generating apparatus and the radiation detecting apparatus in coordination with each other.

15. A radiation generating tube comprising:
a vacuum envelope formed by an insulating tube, a cathode and an anode, the cathode being bonded to one of openings of the insulating tube, and the anode being bonded to other one of the openings of the insulating tube;
an electron emission source connected to the cathode; and
a target connected to the anode,
wherein at least one of the cathode and the anode is bonded to the insulating tube via a conductive bonding material disposed between bonded surfaces facing each other,
wherein the conductive bonding material is partly protruding from between the bonded surfaces to an outer peripheral surface or an inner peripheral surface of the insulating tube, and
wherein a concave portion is formed on the outer peripheral surface or the inner peripheral surface of the insulating tube adjacent to a bonded surface on an insulating tube side, and a distal end of the conductive bonding material protruding is accommodated in the concave portion.

* * * * *